(12) United States Patent
Lee et al.

(10) Patent No.: US 7,449,366 B2
(45) Date of Patent: Nov. 11, 2008

(54) WAFER LEVEL PACKAGING CAP AND FABRICATION METHOD THEREOF

(75) Inventors: Moon-chul Lee, Yongin-si (KR); Jong-oh Kwon, Suwon-si (KR); Woon-bae Kim, Suwon-si (KR); Ji-hyuk Lim, Suwon-si (KR); Suk-jin Ham, Seoul (KR); Jun-sik Hwang, Yongin-si (KR); Chang-youl Moon, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 334 days.

(21) Appl. No.: 11/365,838

(22) Filed: Mar. 2, 2006

(65) Prior Publication Data

US 2007/0085195 A1    Apr. 19, 2007

(30) Foreign Application Priority Data

Oct. 19, 2005   (KR) ..................... 10-2005-0098433

(51) Int. Cl.
*H01L 21/00*      (2006.01)
(52) U.S. Cl. .................... 438/115; 438/125; 257/704; 257/E21.5; 257/E21.505
(58) Field of Classification Search ............... 438/115, 438/125; 257/704, E21.5, E21.505
See application file for complete search history.

(56) References Cited

U.S. PATENT DOCUMENTS

| | | | | |
|---|---|---|---|---|
| 5,561,085 A | * | 10/1996 | Gorowitz et al. | 438/125 |
| 6,756,668 B2 | * | 6/2004 | Baek et al. | 257/704 |
| 6,953,990 B2 | * | 10/2005 | Gallup et al. | 257/678 |
| 7,061,099 B2 | * | 6/2006 | Lu et al. | 257/704 |
| 7,275,424 B2 | * | 10/2007 | Felton et al. | 73/104 |
| 7,357,017 B2 | * | 4/2008 | Felton et al. | 73/104 |
| 7,368,080 B2 | * | 5/2008 | Tamura et al. | 422/63 |

\* cited by examiner

*Primary Examiner*—David A Zarneke
(74) *Attorney, Agent, or Firm*—Sughrue Mion, PLLC

(57) ABSTRACT

A wafer level packaging cap for covering a device wafer with a device thereon and a fabrication method thereof are provided. The method includes operations of forming a plurality of connection grooves on a wafer, forming a seed layer on the connection grooves, forming connection parts by filling the connection grooves with a metal material, forming cap pads on a top surface of the wafer to be electrically connected to the connection parts, bonding a supporting film with the top surface of the wafer on which the cap pads are formed, forming a cavity on a bottom surface of the wafer to expose the connection parts through the cavity, and forming metal lines on the bottom surface of the wafer to be electrically connected to the connection parts.

18 Claims, 7 Drawing Sheets

US 7,449,366 B2

WAFER LEVEL PACKAGING CAP AND FABRICATION METHOD THEREOF

CROSS-REFERENCE TO RELATED APPLICATIONS

This application claims priority from Korean Patent Application No. 10-2005-0098433 filed on Oct. 19, 2005, in the Korean Intellectual Property Office, the disclosure of which is incorporated herein by reference in its entirety.

BACKGROUND OF THE INVENTION

1. Field of the Invention

The present invention relates to a wafer level packaging method and, more particularly, to a wafer level packaging cap for the wafer level packaging and a fabrication method thereof.

2. Description of the Related Art

Generally, devices manufactured as a chip unit and performing certain functions are extremely vulnerable to damage from moisture, particles, and high temperature, and therefore, need to be packaged. Examples of the devices include microscopic mechanisms such as a Radio Frequency (RF) filter, RF switch and Radio Frequency Micro Electro Mechanical System (RF MEMS), and an actuator.

For the package, a top surface of a device wafer, which has a device for performing certain functions, is covered and hermetically sealed with a cap having a cavity providing a space capable of receiving the device.

The term "wafer level packaging" means that, prior to dicing the wafer with a plurality of devices into individual chips, the wafer is hermetically sealed and packed with a packaging cap formed as a wafer unit.

The device wafer includes a device substrate, a device formed on a top portion of the device substrate to perform a certain function and a plurality of device pads electrically connected with the device, and is manufactured according to a general semiconductor fabrication process.

The packaging cap comprises a cap substrate having at the bottom surface a cavity of a certain volume providing a space for receiving the device and integrally packed with the device wafer, a plurality of first metal lines formed at the bottom surface of the cap substrate to correspond to a plurality of the device pads electrically connected to the device, a plurality of second metal lines formed from the bottom surface of the cap substrate to an inner surface of the cavity to correspond to each of the first metal lines, a plurality of connection holes penetrating to the top surface of the cap substrate to correspond to each of the second metal lines, a plurality of connection parts formed in each of the plurality of the connection holes and having the bottom portion electrically connected to each of the plurality of second metal lines, and a plurality of cap pads formed at the top surface of the cap substrate and electrically connected to each of top portions of the plurality of connection parts.

Sealing lines, formed of solder, on both of the device wafer and the packaging cap are melted and bonded to complete the packaging.

The fabrication method of the above packaging cap will be explained with reference to FIGS. 1A through 1E.

First, a wafer 10 is provided to be a cap substrate of a packaging cap as shown in FIG. 1A. A cavity is formed on a bottom portion of the wafer 10 according to a certain process, and a seed metal is deposited to cover the surface of the cavity and the bottom portion of the wafer 10 to form a seed layer 11.

As shown in FIG. 1B, mask patterns are formed on a top surface, i.e., an opposite side of the side with seed layer 11, of the wafer 10, and connection holes 10a are etched according to a dry etching by using an Inductively Coupled Plasma Reactive Ion Etching (ICP-RIE) process until the wafer 10 is completely penetrated.

Then, masks, forming the pattern (not shown) of the connection holes 10a, are removed according to an ashing process, and metal is deposited by plating from the seed layer 11 of the bottom of the connection holes 10a to form connection parts 12 as shown in FIG. 1C. The heights of the plurality of connection parts 12 are not identical, and therefore, the heights become identical and are cleaned according to a lapping and Chemical Mechanical Polishing (CMP) process.

Then, metal is deposited on the top surface of the wafer 10 and patterned according to a photolithography to form cap pads 13 electrically connected with the connection parts 12 as shown in FIG. 1D.

The seed layer of the bottom surface of the wafer 10 is patterned according to a photolithography to form first metal lines 11' (refer to FIG. 1D). On the bottom surface of the wafer 10, second metal lines 14 connected to the first metal lines 11', and sealing lines 15 are formed. The sealing lines 15 are used for packaging with the device substrate during the following packaging process.

Then, the completed packaging cap 1 is packaged with the top portion of the device wafer 2 as shown in FIG. 1E.

However, the packaging cap manufactured according to the above process has disadvantages as follows:

The wafer of the packaging cap should be manufactured to be thick in order to prevent breakage or damage of the wafer during the fabrication process. Therefore, the size of packaging cap increases.

The connection holes should be fabricated to penetrate the wafer so that it takes a long time to fabricate the packaging cap. Silicon (Si) wafer is generally used for the cap substrate; however, the silicon wafer can not have the cap substrate less than 300 μm due to the fabrication limitation thereof. Accordingly, the manufacturing cost cannot be reduced.

As described above, the connection holes are formed to penetrate the wafer. Therefore, much time is required to plate the deep connection holes with metal material so that the entire cost can increase.

The metal material is directly plated onto the connection holes formed on the cap substrate so that the metal material is not stably connected to the connection holes. Therefore, the electrical stability decreases.

SUMMARY OF THE INVENTION

The present invention has been conceived to solve the above-mentioned problems, and an aspect of the present invention is to provide a wafer level packaging cap with an enhanced structure in which a thin cap substrate can be fabricated, and fabrication method thereof.

In order to achieve the above aspects, there is provided a wafer level packaging cap which covers a device wafer with a device thereon, including a cap substrate having on a bottom surface a cavity providing a space for receiving the device, and integrally combined with the device wafer, a plurality of metal lines formed on the bottom surface of the cap substrate to correspond to each of a plurality of device pads electrically connected to the device, a plurality of connection parts formed to penetrate from the bottom surface to a top surface of the cap substrate to correspond to each of the metal lines, bottom portions of the connection parts being electrically connected to the metal lines, a plurality of cap pads formed at the top surface of the cap substrate to be electrically connected to the plurality of connection parts, and a seed layer formed at a boundary between the connection parts and the cap substrate.

The cap substrate may be a silicon wafer.

The connection parts may be formed by plating connection grooves, penetrating through the cap substrate, with a metal material.

The inner circumferential surfaces of the connection grooves may be oxidized to deposit the seed layer thereon.

The connection parts may be formed at the cavity, and the metal lines continually formed by extending from the bottom surface of the cap substrate over slant sides of the cavity towards bottom portions of the connection grooves of the cavity.

The cap substrate may further comprise cap sealing lines corresponding to the sealing lines of the device wafer.

In order to achieve the above aspects, there is provided a fabrication method of a wafer level packaging cap for covering a device wafer with a device thereon, including forming a plurality of connection grooves on a wafer, forming a seed layer on the connection grooves, forming connection parts by plating the connection grooves with a metal material, forming cap pads on a top surface of the wafer to be electrically connected to the connection parts, bonding a supporting film with the top surface of the wafer on which the cap pads are formed, forming a cavity on a bottom surface of the wafer to expose the connection parts through the cavity, and forming metal lines on the bottom surface of the wafer to be electrically connected to the connection parts.

The operation of forming the connection grooves may include patterning a mask on the wafer to correspond to the connection grooves, etching the wafer exposed by the patterned mask, from the top surface in a certain depth to fabricate the connection grooves, and removing the patterned mask and cleaning a surface of the wafer.

The operation of forming the seed layer may include oxidizing a surface of the wafer on which the connection grooves are formed, and depositing a top surface of the oxidized wafer and an inner surface of the connection grooves with a metal material to deposit the seed layer.

The operation of forming the connection parts may comprise plating the seed layer with the metal material to fill the connection grooves, and removing a top portion of the wafer by a certain thickness to expose the wafer and the metal material filling the connection grooves.

In the operation of exposing, the seed layer, the plated metal layer and the oxidized portion may be all removed from the wafer by a planarization process.

The operation of exposing the connection parts may include grinding a bottom portion of the wafer by a certain thickness to reduce a thickness of the wafer, and removing by a certain depth a part of the bottom surface of the wafer with the reduced thickness to form the cavity to expose the connection parts.

The operation of reducing the thickness may be performed by a Chemical Mechanical Polishing (CMP) process.

The operation of forming the cavity may be performed by using an Inductively Coupled Plasma Reactive Ion Etching (ICP-RIE) process.

In the operation of forming the cavity, the bottom portion of the wafer may be etched to such a depth as to expose the metal material plated on the connection grooves.

In the operation of forming the metal lines, the metal material is patterned by the patterned mask so as to be continuously extended from the connection parts, exposed to the cavity, towards an inner surface of the cavity and the bottom surface of the wafer.

The method may further include forming a cap sealing line on the bottom surface of the wafer to be bonded with a sealing line of the device wafer.

The method may further include removing the supporting film after forming the metal line and the cap sealing line.

The supporting film may have a thickness of approximately 100 μm through 200 μm, and the supporting film includes an ultra violet (UV) tape.

BRIEF DESCRIPTION OF THE DRAWINGS

The above and other aspects, features and advantages of the present invention will be more apparent from the following detailed description taken with reference to the accompanying drawings, in which.

DETAILED DESCRIPTION OF THE EXEMPLARY EMBODIMENTS

Figure 1A:
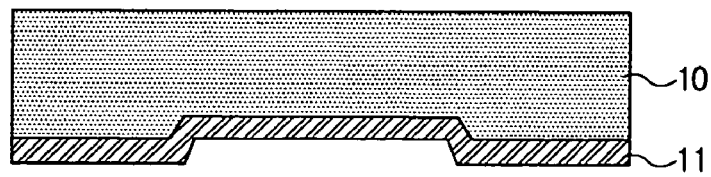
FIGS. 1A through 1E are process view of a fabrication method of a wafer level packaging cap according to a conventional art.
Figure 1B:
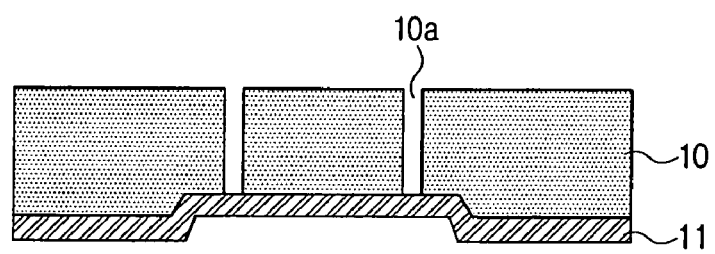
Figure 1C:
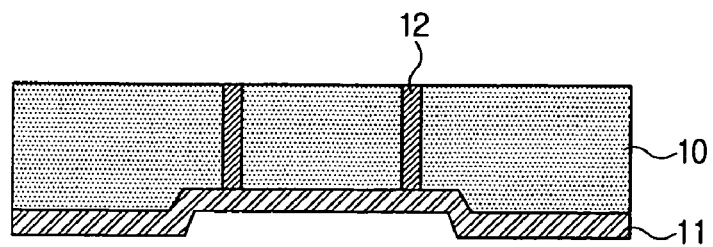
Figure 1D:
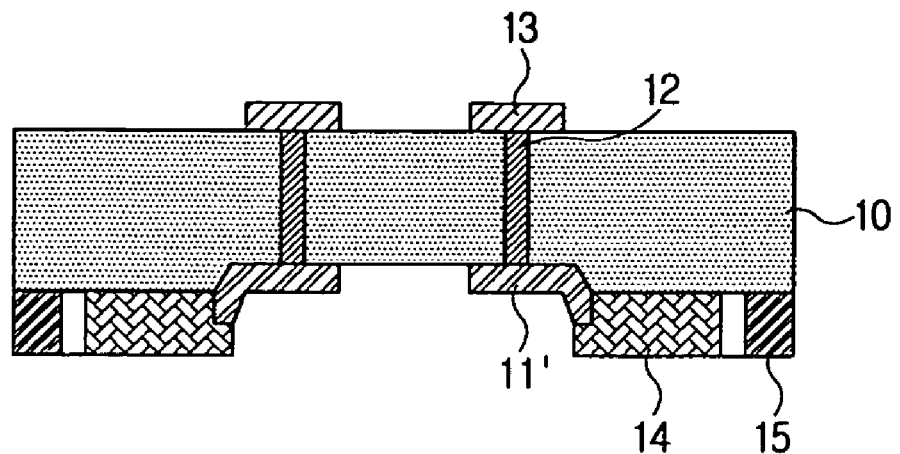
Figure 1E:
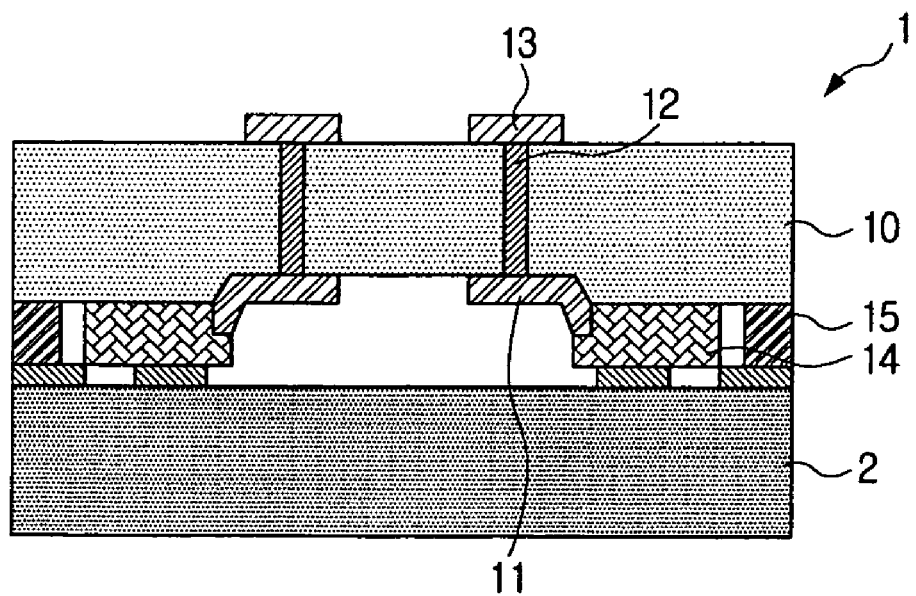

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity.

Figure 2A:
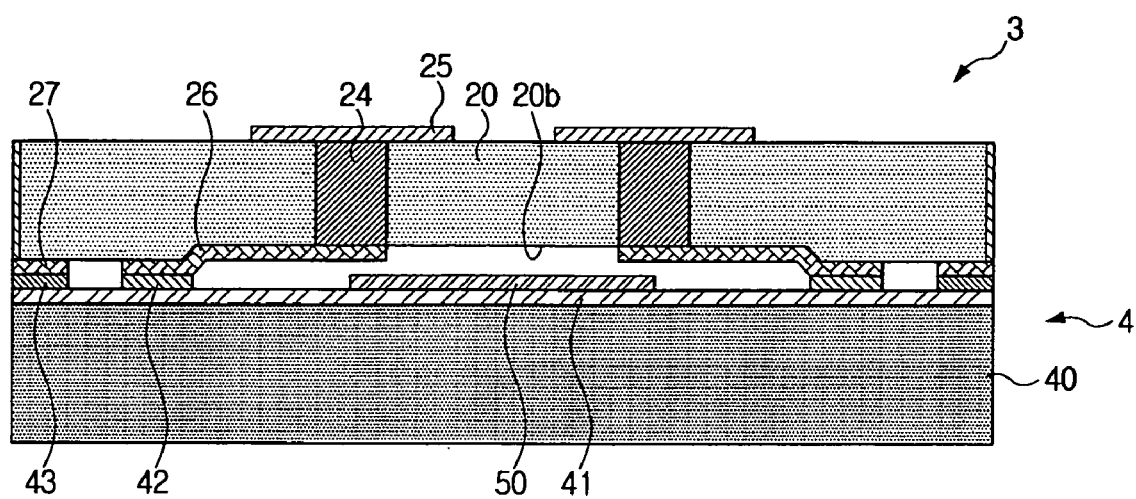
FIG. 2A is a cross-sectional view of a chip packaged with a wafer level packaging cap according to an embodiment of the present invention.
Figure 2B:
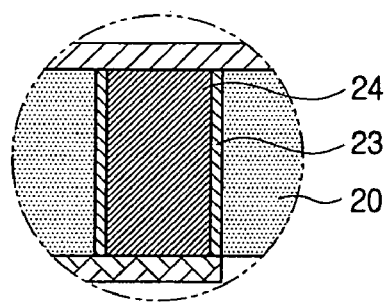
FIG. 2B is an enlarged cross-sectional view of a connection part of the wafer level packaging cap according to an embodiment of the present invention.

Referring to FIGS. 2A and 2B, a wafer level packaging cap 3 according to an embodiment of the present invention comprises a cap substrate 20, a plurality of metal lines 26, a plurality of connection parts 24 and a plurality of cap pads 25.

The cap substrate 20 covering a top portion of a cap device wafer 4, has at the bottom surface a cavity 20b of a certain volume providing a space for receiving a device 50. The plurality of metal lines are formed at the bottom surface of the cap substrate 20 to correspond to a plurality of device pads 42 electrically connected to the device 50. The plurality of connection parts 24 are formed to penetrate from the bottom surface to the top surface of the cap substrate 20 to correspond to each of the metal lines 26. The plurality of cap pads 25 are formed at the top surface of the cap substrate 20 and electrically connected to each of top portions of the plurality of connection parts 24.

The cap substrate 20 is a silicon wafer, and hereinafter is called a wafer. The cavity 20b is formed in a certain depth and width at a part of a bottom surface of the cap wafer 20. The connection parts 24 are exposed through the cavity 20b to the bottom surface of the wafer 20 so as to be electrically connected to the metal lines 26.

A plurality of the metal lines 26 are provided to extend from an inner side of the cavity 20b over a slant side towards the bottom surface of the wafer 20 except for the cavity 20b so as to be electrically connected to the bottom portion of the connection parts 24.

The connection parts 24 are formed to penetrate through the wafer 20. The bottom portions of the connection parts 24 are electrically connected to the metal lines 26, and the top portions thereof are electrically connected to the cap pads 25. The connection parts 24 are formed by plating connection grooves formed in the wafer 20 with metal material such as copper. The connection grooves will be explained later. As shown in FIG. 2B, seed layers 23 are formed at plated portions, i.e., the boundary between the wafer 20, of the connection parts 24. The seed layers 23 are formed by depositing metal material with a certain thickness into the connection grooves before the connection parts 24 are formed by plating the connection grooves formed in the wafer 20 with the metal material. The seed layer 23 can be formed by oxidizing the surface of the wafer 20, i.e., the inner side of the connection grooves before depositing. This will be explained later.

After being formed according to the above process, the seed layers 23 are plated with metal material to form the connection parts 24 so that the electric quality of the connection parts 24 can be enhanced and the binding thereof can be also enhanced by plating. Therefore, the connection parts 24 can have a stable electric quality.

A plurality of cap pads 25 are formed on the top surface of the wafer 20 so as to be electrically connected to each of the connection parts 24.

Sealing lines 27 are formed at the edges of the bottom surface of the wafer 20 so as to be bonded with the sealing lines 43 formed on the packaging surface of the wafer body 40 of the device wafer 4.

In FIG. 2A, the reference numeral 41 denotes an insulation layer formed on the packaging surface of the wafer body 40. On the insulation layer 41, a device 50, device pads 42 and the sealing lines 43 are formed. The cavity 20b provides a space for receiving the device 50 performing a certain function, and is formed by etching a part of the bottom surface of the wafer 20. Accordingly, the size of the cavity 20b is set depending on the device 50 of certain function formed on the device wafer 4.

The cap pads 25 allows the device 50 covered with the packaging cap 3 to electrically connect to an external device, and a plurality of the cap pads 25 are provided to correspond to the number of the device pads 42.

The packaging cap 3 is bonded with the device wafer 4 on which the device 50 performing a certain function is formed, by using solder, i.e., the sealing lines 27, 43 so that the packaging of the chip is completed.

The fabrication method of the wafer level packaging cap 3 with the above structure will be explained hereinafter.

Figure 3A:
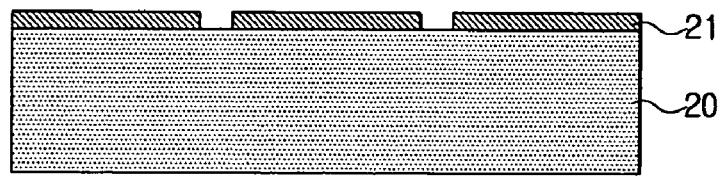
FIGS. 3A through 4E are process views of a fabrication method of the wafer level packaging cap according to an embodiment of the present invention.
Figure 3B:
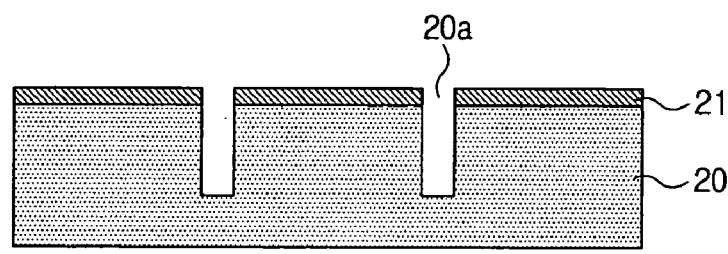

As shown in FIG. 3A, a wafer 20 of a certain thickness is provided to form the cap substrate. The initial wafer 20 may have a thickness of approximately 300 μm. A mask 21 is patterned on the top surface of the wafer 20. As shown in FIG. 3B, the top surface of the wafer 20, exposed by the patterning of the mask 21, is etched away in a certain depth to form the connection grooves 20a. The connection grooves 20a are etched according to dry-etching, and may have a thickness of approximately 150 μm. Here, the dry-etching may be performed by using an Inductively Coupled Plasma Reactive Ion Etching (ICP-RIE) process.

Figure 3C:
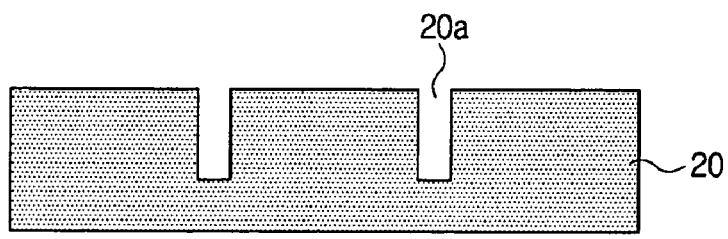

As shown in FIG. 3C, the mask 21 is removed by ashing and cleaning processes, and contaminants on the wafer 20 are removed.

Figure 3D:
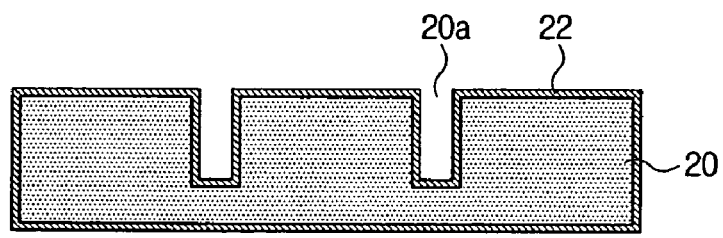

As shown in FIG. 3D, the entire surface of the wafer 20 is oxidized into an oxidized layer 22. The oxidized layer 22 is formed over the top portion, the bottom portion and the side portions of the wafer 20, and the inner side of the connection groves 20a.

Figure 3E:
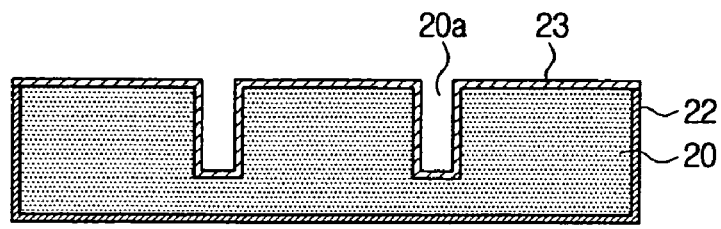

As shown in FIG. 3E, the seed layer 23 for electroplating is deposited and formed on the top surface of the wafer 20 and the inner side of the connection parts 20a.

Figure 3F:
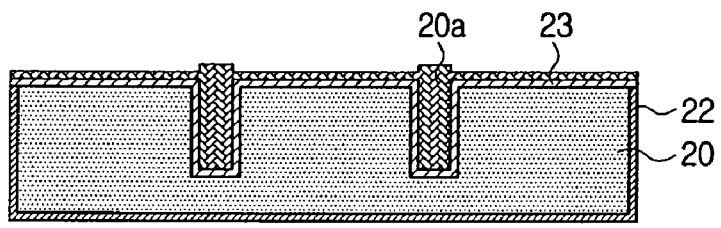

As shown in FIG. 3F, the top surface of the wafer 20, i.e., the surface of the seed layer 23 is electroplated with metal material so that the connection grooves 20a are filled with metal material that will be the connection parts 24 later. Here, the metal material may be copper (Cu), aurum (Au) and nickel (Ni).

Figure 3G:
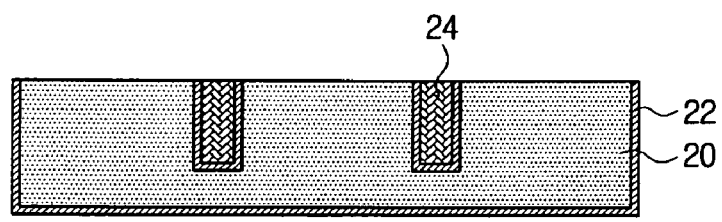

After depositing the metal material by electroplating as above, a part of the top portion of the wafer 20 is removed by a certain thickness and planarized according to a mechanical grinding as shown in FIG. 3G. Then, the metal material plated on the wafer 20, the seed layer 23 and the oxidized layer 22 are all removed so that the top portions of the wafer 20 and the connection parts 24 are exposed.

Figure 3H:
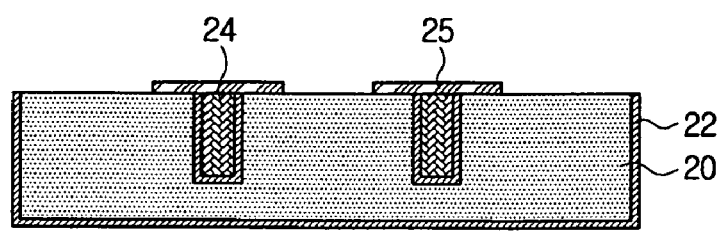

As shown in FIG. 3H, metal material is patterned on the planarized wafer 20 to form a plurality of cap pads 25. The cap pads 25 correspond to the number of the connection pads 24, and the cap pads 25 are electrically connected to each of the corresponding connection parts 24, respectively.

Figure 4A:
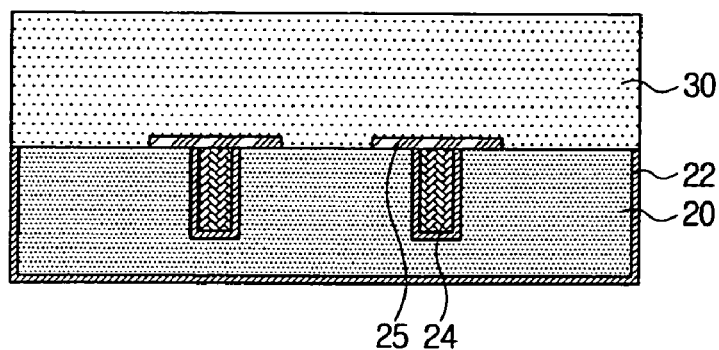

After the cap pads 25 are formed on the wafer 20 as above, a supporting film 30 is bonded with the top surface of the wafer 20 as shown in FIG. 4A. Here, the supporting film 30 may be an ultra violet (UV) tape. The UV tape operates as a reinforcement member, that is, strengthens the wafer 20 and prevents breakages or damage during the fabrication process of the wafer 20. The supporting film 30 may have a thickness corresponding to the thickness, i.e., 100 μm through 200 μm, of the wafer 20 when the cap pads 25 are formed.

If the supporting film 30 is bonded with the top portion of the wafer 20, the limitation of the strength and thickness of the wafer can be increased for moving and operating the wafer 20 so that a thin wafer can be easily manufactured.

Figure 4B:
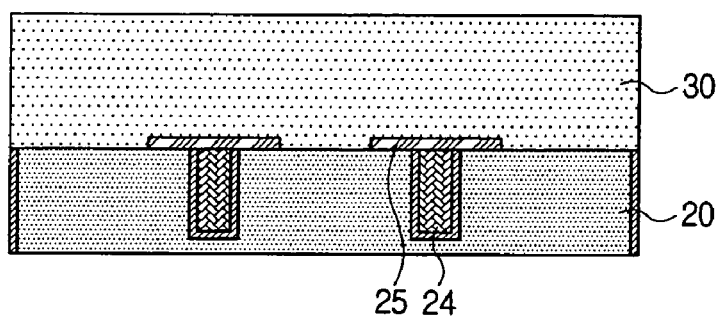

The bottom portion of the wafer 20 bonded with the supporting film 30 is ground by a certain thickness according to a Chemical Mechanical Polishing (CMP) process as shown in FIG. 4B so as to reduce the entire thickness. Here, the wafer 20 ground according to the CMP process may have a thickness of approximately 120 μm so that the bottom portion of the connection parts 24 cannot be exposed.

Figure 4C:
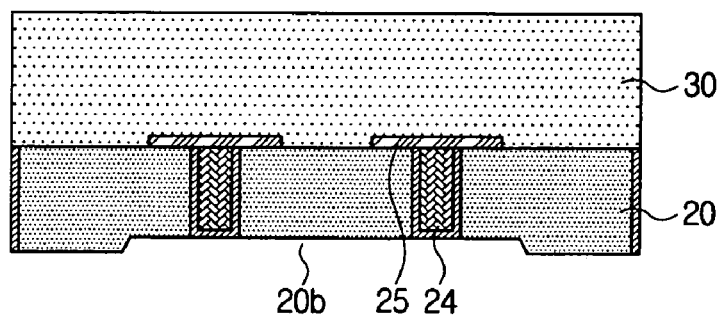

As shown in FIG. 4C, the bottom surface of the wafer 20 is removed according to a certain process to form the cavity 20b to expose the connection parts 24. The depth of the cavity 20b is set depending on the size of the device 50 and sufficient to expose the connection parts 24. The cavity 20b is fabricated according to an etching process. The etching process may be performed according to a dry etching by using ICP-RIE process.

Figure 4D:
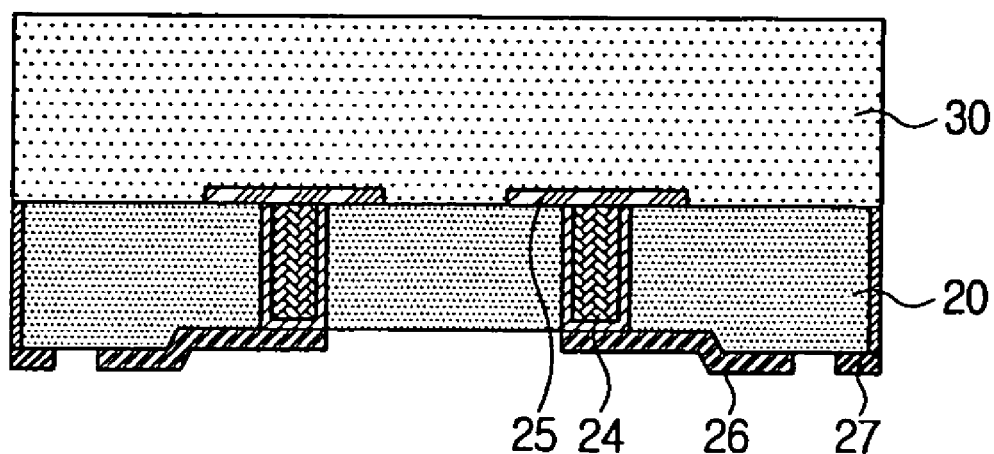

After the cavity 20b is formed, a plurality of metal lines 26 are patterned and formed on the bottom surface of the wafer 20 as shown in FIG. 4D. A plurality of the metal lines 26 are formed to be electrically connected to the connection parts 24. Each metal line 26 may be continually formed by extending from the inner side of the cavity 20b over the slant side towards the bottom surface of the wafer 20 around the cavity 20b.

The sealing lines 27 are patterned and formed at the edges of the bottom surface of the wafer 20. The sealing lines 27 may be solder.

Figure 4E:
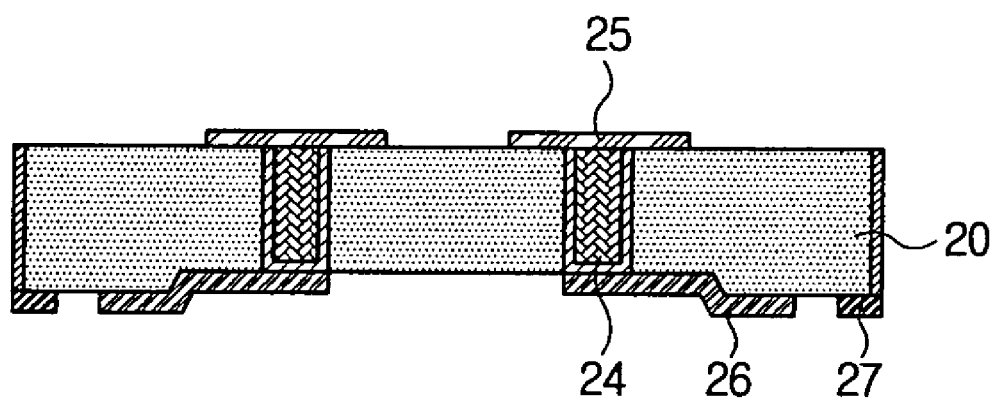

After the metal lines 26 and the sealing lines 27 are formed, the supporting film 30 is removed so that the packaging cap 3 is completed as shown in FIG. 4E.

The completed packaging cap 3 is bonded with the packaging surface of the device wafer 4 as shown in FIG. 2A so that the packaging can be completed.

As described above, if the wafer level packaging cap and the fabrication method thereof according to embodiments of the present invention are applied, the oxidized layer and seed layer are formed at the connection grooves, through which the connection parts are formed, of the wafer to protect the connection parts. Therefore, the metal material can be stably plated so that the physical and electric features of the connection parts can be enhanced.

During the fabrication process of the packaging cap, the supporting film is bonded with the wafer to fabricate the wafer. Therefore, the packaging cap can be completely fabricated before packaged with the device wafer. Accordingly, various devices can be simultaneously fabricated on the wafer so that the convenience can be enhanced and an effective yield can be obtained.

The strength of the wafer is reinforced by the supporting film to fabricate the wafer so that the wafer can be fabricated thinner in comparison with conventional art. Therefore, miniaturization and integration can be performed.

Additionally, only the connection grooves are formed in a certain depth to form the connection parts without requiring to penetrate the wafer. Therefore, the time for ICP RIE fabrication and plating to form the connection grooves can be reduced and the entire manufacturing cost can be reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A fabrication method of a wafer level packaging cap for covering a device wafer with a device thereon, comprising:
    forming a plurality of connection grooves on a wafer;
    forming a seed layer on the connection grooves;
    forming connection parts by plating the connection grooves with a metal material;
    forming cap pads on a top surface of the wafer to be electrically connected to the connection parts;
    bonding a supporting film with the top surface of the wafer on which the cap pads are formed;
    forming a cavity on a bottom surface of the wafer to expose the connection parts through the cavity; and
    forming metal lines on the bottom surface of the wafer to be electrically connected to the connection parts.

2. The fabrication method according to claim 1, wherein the operation of forming the connection grooves comprises:
    patterning a mask on the wafer to correspond to the connection grooves;
    etching the wafer exposed by the patterned mask, from the top surface in a certain depth to fabricate the connection grooves; and
    removing the patterned mask and cleaning a surface of the wafer.

3. The fabrication method according to claim 1, wherein the operation of forming the seed layer comprises:
    oxidizing a surface of the wafer on which the connection grooves are formed; and
    depositing a top surface of the oxidized wafer and an inner surface of the connection grooves with a metal material to deposit the seed layer.

4. The fabrication method according to claim 3, wherein the operation of forming the connection parts comprises:
    plating the seed layer with the metal material to fill the connection grooves; and
    removing a top portion of the wafer by a certain thickness to expose the wafer and the metal material filling the connection grooves.

5. The fabrication method according to claim 4, wherein in the operation of exposing, the seed layer, the plated metal layer and the oxidized portion are all removed from the wafer by a planarization process.

6. The fabrication method according to claim 1, wherein the operation of exposing the connection parts comprises:
    grinding a bottom portion of the wafer by a certain thickness to reduce a thickness of the wafer; and
    removing by a certain depth a part of the bottom surface of the wafer with the reduced thickness to form the cavity to expose the connection parts.

7. The fabrication method according to claim 6, wherein the operation of reducing the thickness is performed by a Chemical Mechanical Polishing (CMP) process.

8. The fabrication method according to claim 7, wherein the operation of forming the cavity is performed by using an Inductively Coupled Plasma Reactive Ion Etching (ICP-RIE) process.

9. The fabrication method according to claim 4, wherein the operation of exposing the connection parts comprises:
    grinding a bottom portion of the wafer by a certain thickness to reduce a thickness of the wafer; and
    removing by a certain depth a part of the bottom surface of the wafer with the reduced thickness to form the cavity to expose the connection parts.

10. The fabrication method according to claim 9, wherein the operation of reducing the thickness is performed by a Chemical Mechanical Polishing (CMP) process.

11. The fabrication method according to claim 10, wherein the operation of forming the cavity is performed by using an Inductively Coupled Plasma Reactive Ion Etching (ICP-RIE) process.

12. The fabrication method according to claim 9, wherein in the operation of forming the cavity, the bottom portion of the wafer is etched to such a depth as to expose the metal material plated on the connection grooves.

13. The fabrication method according to claim 9, wherein in the operation of forming the metal lines, the metal material is patterned by the patterned mask so as to be continuously extended from the connection parts, exposed to the cavity, towards an inner surface of the cavity and the bottom surface of the wafer.

14. The fabrication method according to claim 6, wherein in the operation of forming the metal lines, the metal material is patterned by the patterned mask so as to be continuously extended from the connection parts, exposed to the cavity, towards an inner surface of the cavity and the bottom surface of the wafer.

15. The fabrication method according to claim 1, further comprising:
    forming a cap sealing line on the bottom surface of the wafer to be bonded with a sealing line of the device wafer.

16. The fabrication method according to claim 15, further comprising:
    removing the supporting film after forming the metal lines and the cap sealing line.

17. The fabrication method according to claim 15, wherein the supporting film has a thickness of approximately 100 μm through 200 μm.

18. The fabrication method according to claim 15, wherein the supporting film includes an ultra violet (UV) tape.

* * * * *